United States Patent
Wiegand et al.

(10) Patent No.: US 7,501,072 B2
(45) Date of Patent: Mar. 10, 2009

(54) ETCHING SOLUTION COMPRISING HYDROFLUORIC ACID

(75) Inventors: Claudia Wiegand, Darmstadt (DE); Rudolf Rhein, Heppenheim (DE); Eberhard Tempel, Seeheim-Jugenheim (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 0 days.

(21) Appl. No.: 11/730,480

(22) Filed: Apr. 2, 2007

(65) Prior Publication Data

US 2007/0218700 A1     Sep. 20, 2007

Related U.S. Application Data

(62) Division of application No. 10/031,787, filed as application No. PCT/EP00/06314 on Jul. 5, 2000, now abandoned.

(30) Foreign Application Priority Data

Jul. 28, 1999 (DE) .................... 199 35 446

(51) Int. Cl.
*H01L 21/302* (2006.01)
(52) U.S. Cl. ..................................... 216/99
(58) Field of Classification Search .............. None
See application file for complete search history.

(56) References Cited

U.S. PATENT DOCUMENTS

| | | | |
|---|---|---|---|
| 3,642,549 A | 2/1972 | Couture et al. | |
| 4,569,722 A | 2/1986 | Maury et al. | |
| 5,478,436 A * | 12/1995 | Winebarger et al. | 438/693 |
| 5,767,020 A | 6/1998 | Sakaguchi et al. | |
| 6,316,370 B1 | 11/2001 | Mercaldi et al. | |
| 6,562,726 B1 * | 5/2003 | Torek et al. | 438/745 |

FOREIGN PATENT DOCUMENTS

| | | |
|---|---|---|
| CH | 664 978 | 4/1988 |
| GB | 1 228 083 | 4/1971 |
| JP | 55-030826 | 3/1980 |
| JP | 01-125831 | 5/1989 |
| SV | 628161 | 8/1978 |

OTHER PUBLICATIONS

Pushechnikov, *Database WPI*, Abstract of SU 628 161.

* cited by examiner

*Primary Examiner*—Allan Olsen
(74) *Attorney, Agent, or Firm*—Millen, White, Zelano, Branigan, P.C.

(57) ABSTRACT

This invention relates to etching solutions which comprise hydrofluoric acid and organic solvents for use in the process for the production of integrated circuits. The etching solutions according to the invention are particularly suitable for the selective etching of doped silicate layers.

18 Claims, 4 Drawing Sheets

ETCHING SOLUTION COMPRISING HYDROFLUORIC ACID

This patent is a divisional of U.S. patent application Ser. No. 10/031,787, filed May 20, 2002, now abandoned which is the national stage entry of PCT/EP00/06314, filed Jul. 5, 2000.

This invention relates to etching solutions comprising hydrofluoric acid and organic solvents for use in the process for the production of integrated circuits. The etching solutions according to the invention are particularly suitable for the selective etching of doped silicate layers.

In the semiconductor industry, various types of integrated circuit are produced by the deposition of various dielectric layers. These can be, for example, deposited borosilicate glass (BSG) layers, phosphorus-silicate glass (PSG) layers, boron-phosphorus-silicate glass (BPSG) layers, oxide layers of thermal oxide or oxide layers deposited from tetraethyl orthosilicate (TEOS).

At various points of the semiconductor process, doped glass layers are usually applied to undoped glass layers. These are usually boron-doped glass (BSG) on a thermal oxide, phosphorus-doped glass (PSG) on a thermal oxide or boron-phosphorus-doped (BPSG) glass on a thermal oxide. The abovementioned layers can also be applied to a TEOS oxide.

After these doped layers have been applied, they must be removed again in places by etching. Depending on the intended application, it may be necessary to etch BSG, PSG or BPSG layers selectively to give thermal or TEOS oxide.

Since the doped layers exhibit a surface topography, due to the underlying structures, the layer thickness to be removed is not the same in all areas of the wafer. However, in order to remove sufficient material in all areas to be etched, the etching time must be selected to be sufficiently long for even the thickest layers to be etched through. Since the etching medium in this so-called over-etching time acts on the underlying thermal or TEOS oxide in the areas with an originally thinner layer of doped glass, an etching medium is necessary which etches the doped oxides at a much higher rate than the undoped oxides.

For etching in spin etcher operation, preference is given here to mixtures of concentrated $H_2SO_4$ and 50% HF. These mixtures are already selective in respect of various layers and result essentially in a uniform quality of the etched layer.

However, our own experiments with various commercially available etching media have shown inadequate selectivity during etching. It has also been found here that although selective etching can be achieved with other mixtures, the uniformity of the etching is, however, inadequate for the processes.

The object of the present invention is therefore to provide the semiconductor industry with etching mixtures for the production of integrated circuits which, while having a high etching rate, also have significantly improved selectivity and result in uniform etching.

The object is achieved by etching solutions comprising hydrofluoric acid, an organic solvent, individually or as a mixture selected from the group consisting of ethylene glycol, propylene glycol, ethanol and glycerol, and water for the production of integrated circuits.

Hydrofluoric acid is preferably employed in an amount of 5-20% by weight in the etching solutions according to the invention.

In particular, the object is achieved by etching solutions comprising only an organic solvent selected from the group consisting of ethylene glycol, propylene glycol, ethanol and glycerol.

The invention also relates to etching solutions comprising, as organic solvents a mixture consisting of ethylene glycol and glycerol in a mixing ratio of from 1:10 to 10:1.

Etching solutions which have proven good for the purposes of the invention are those which comprise, as organic solvent, ethylene glycol and glycerol in a mixing ratio of from 1:5 to 5:1.

The object on which this invention is based is furthermore achieved by etching solutions comprising water in an amount of from 1 to 20% by weight.

For the purposes of the invention, the object of this invention is achieved by etching solutions comprising a mixture of high-purity individual components.

In particular, the invention also relates to the use of the novel etching solutions described here for the selective etching of doped silicate layers.

The mixtures developed here enable the selectivities and uniformity of etching to be significantly improved depending on the process for the deposition of the individual layers.

It is advantageous that the etching rate achieved with the solutions according to the invention for the etching of PSG layers, BSG layers and BPSG layers is a multiple higher (even >300) than for TEOS layers or layers of thermal oxide.

These selectivities have been observed in the case of etching in a spin etcher and during dip etching processes.

Organic solvents which can be used are ethylene glycol, propylene glycol, ethanol, isopropanol, glycerol and mixtures thereof. The etching rates which can be achieved using these solvents are dependent on the solvents used and on the mixing ratio of the individual organic solvents with one another. The etching rate is furthermore greatly affected by the amount of hydrofluoric acid present in the solution and very particularly by the amount of water present.

The hydrofluoric acid content in the mixtures tested as successful is from 5 to 20% by weight of HF. Suitable solvents are in particular pure ethylene glycol, pure propylene glycol, pure ethanol or pure glycerol. In the case of solvent mixtures, the mixtures of glycerol and ethylene glycol in a ratio of from 1:10 to 10:1, in particular, exhibited a very selective etching behaviour.

Especially in the dip etching process, the etching solutions on which the invention is based exhibit significantly more uniform etching than in the case of commercially available etching solutions.

The following table shows some examples of the selectivities achieved between BSG glass and thermal oxide, achieved in the dip etching process.

TABLE 1

| No. | Organic component | Selectivity (BSG to therm. oxide) |
|---|---|---|
| 1 | Ethylene glycol | 97 |
| 2 | Glycerol | 124 |
| 3 | Ethylene glycol:glycerol = 1:1 | 101 |
| 4 | Ethylene glycol:glycerol = 1:2 | 69 |
| 5 | Ethylene glycol:glycerol = 2:1 | 76 |

A great advantage over the existing mixtures is the evenness of the surface after etching. This improved uniformity has a positive effect on the etching process since it allows the over-etching times to be significantly shortened. Pictures 1 to 3 show SEM photomicrographs of a BSG layer etched by dip etching with spin etch F as comparative solution. An undesired hole which formed in the surface during etching is very clear in photomicrograph 3.

Corresponding holes are not found on use of the etching solutions according to the invention.

Figure 1:
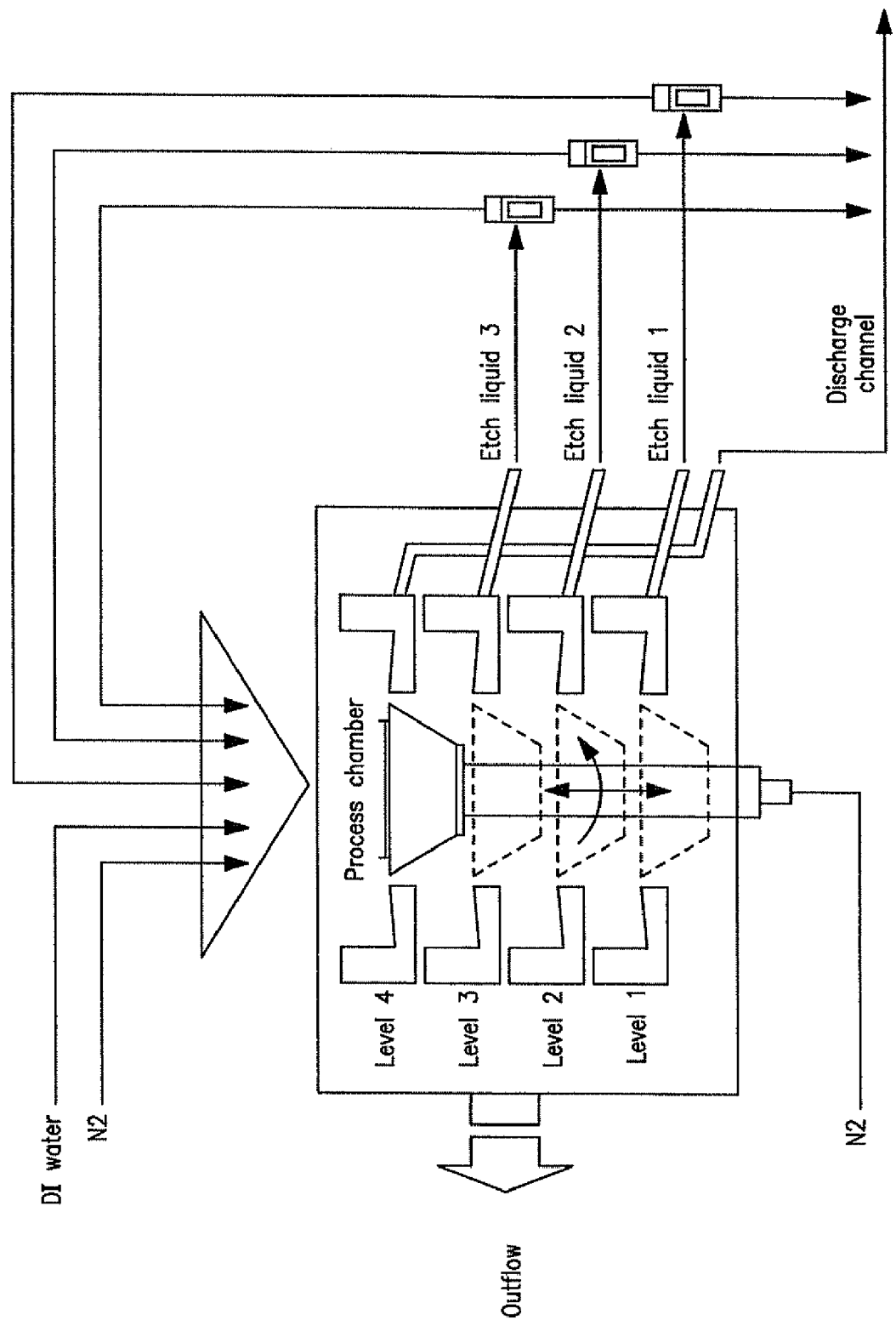
FIG. 1 depicts the mode of operation of a spin etcher.
Figure 2A:
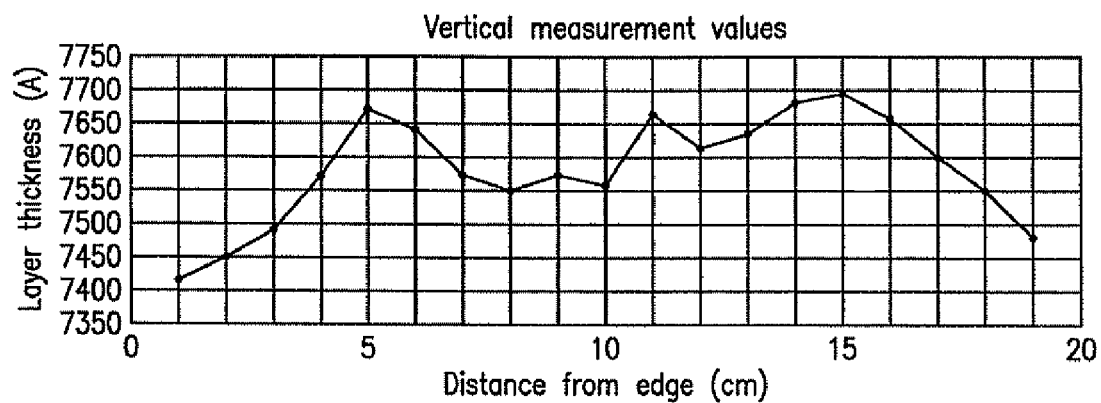
FIG. 2a depicts vertical measurement values of a wafer profile after etching with spin etch F a spin etcher.
Figure 2B:
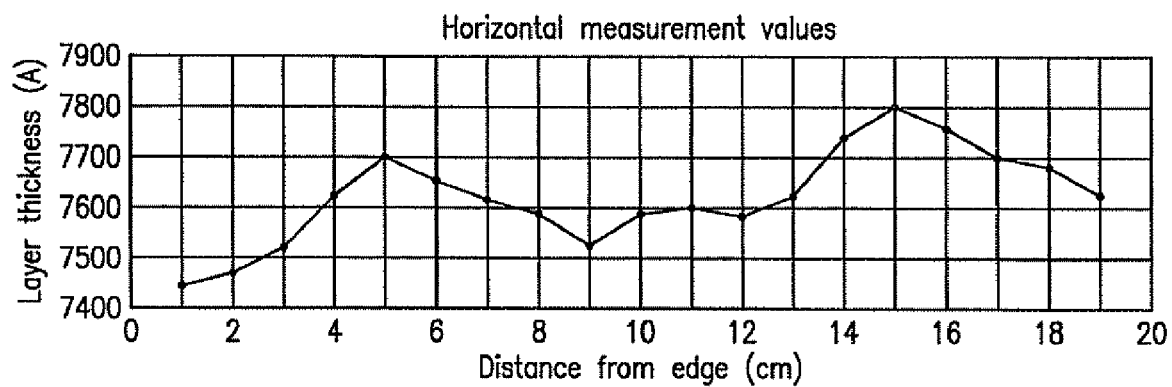
FIG. 2b depicts horizontal measurement values of a wafer profile after etching with spin etch F a spin etcher.
Figure 3A:
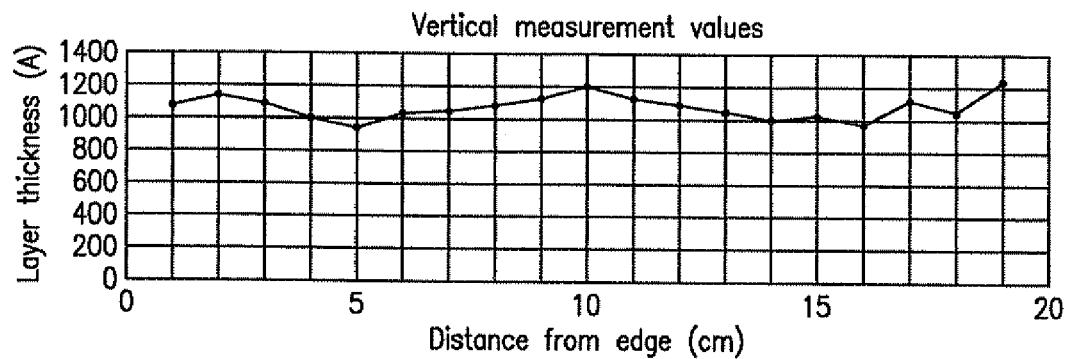
FIG. 3a depicts vertical measurement values of a wafer profile after etching with ethylene glycol/HF 15% a spin etcher.
Figure 3B:
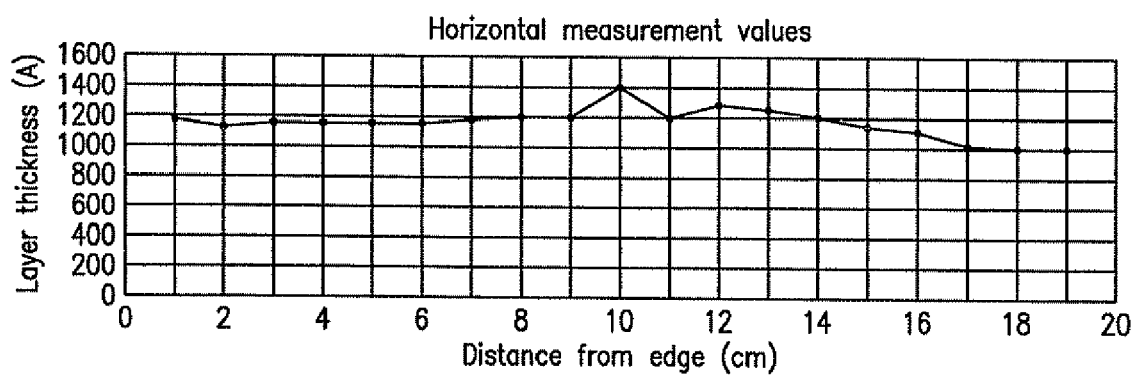
FIG. 3b depicts horizontal measurement values of a wafer profile after etching with ethylene glycol/HF 15% a spin etcher.
Figure 4A:
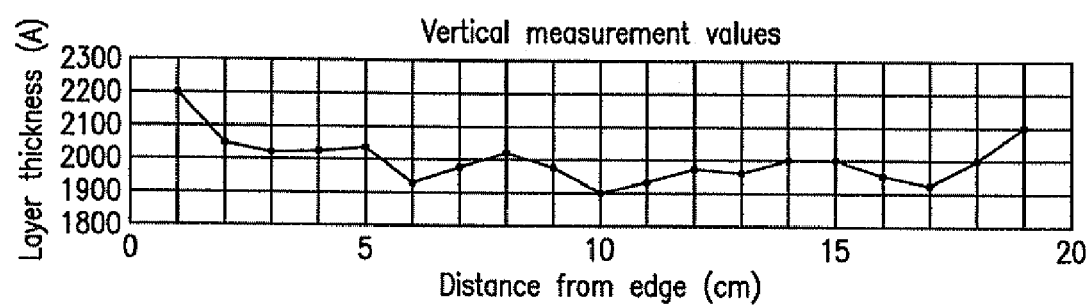
FIG. 4a depicts vertical measurement values of a wafer profile after etching with ethylene glycol/glycerol/HF 15% a spin etcher.
Figure 4B:
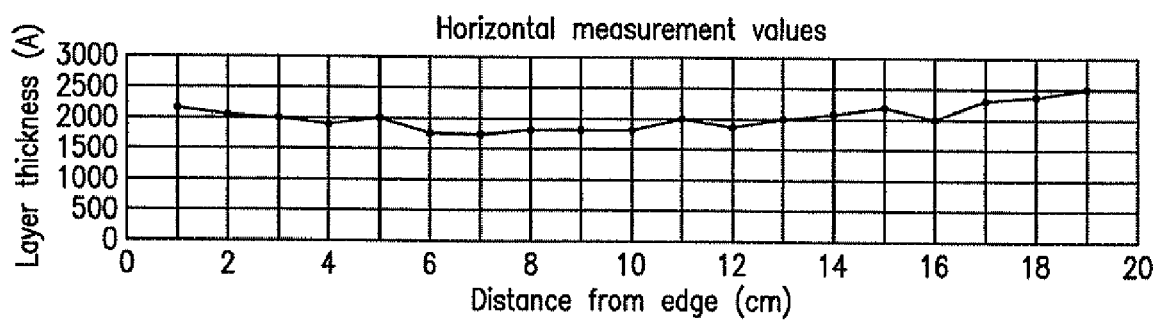
FIG. 4b depicts horizontal measurement values of a wafer profile after etching with ethylene glycol/glycerol/HF 15% a spin etcher.

Experiments with the etching solutions according to invention were carried out in a spin etcher as produced and marketed by SEZ. The solutions can, however, also be used on use of comparable apparatuses. The mode of operation of a spin etcher of this type is explained diagrammatically in FIG. 1.

Diagrams 1-6 show the wafer profile of BSG wafers after the etching operation with two mixtures which are the subject-matter of the application and with spin etch F, a comparative solution. It is clearly evident from these that the layer thickness after etching with spin etch F is significantly less uniform than after etching with the mixtures in accordance with the present invention. All etching experiments were carried out using the same parameters.

In particular, the etching experiments carried out showed that an excessively high water content has an adverse effect on the selectivity of the etching. Good results are accordingly achieved at a water content of from 2 to 20% by weight. Since the water content is essentially determined by the addition of hydrofluoric acid, the strongest possible hydrofluoric acid grades are employed for the preparation of the etching solutions. Instead of 50% hydrofluoric acid, 70% hydrofluoric acid is therefore used.

In order to illustrate the effect of the amount of water present in the etching solution, Table 2 shows how the etching rates, and thus also the selectivities, change in the ethylene glycol/HF mixture at constant HF concentration, but at different water contents.

TABLE 2

| Mixture | Etching rate BSG glass | Thermal oxide |
| --- | --- | --- |
| 70% ethylene glycol + 15% HF + 15% $H_2O$ | 3310 nm/min | 48, nm/min |
| 78.6% ethylene glycol + 15% HF + 6.4% $H_2O$ | 2507 nm/min | 14 nm/min |

The invention claimed is:

1. A method for the selective etching of a doped silicate layer with respect to an undoped silicate layer underlying the doped silicate layer, comprising treating said doped silicate layer with an etching solution consisting essentially of
   5-20% hydrofluoric acid by weight based on hydrogen fluoride,
   an organic solvent individually or as a mixture selected from the group consisting of ethylene glycol, propylene glycol, ethanol, and glycerol, and
   1-20% by weight water,
wherein said solution selectively etches the doped silicate layer while essentially not etching the underlying undoped silicate layer.

2. A method according to claim 1, wherein said doped silicate is boron doped glass.

3. A method according to claim 1, wherein said doped silicate is phosphorous doped glass.

4. A method according to claim 1, wherein said doped silicate is boron-phosphorous doped glass.

5. A method according to claim 1, wherein said selective etching is carried out in a spin etcher.

6. A method according to claim 1, wherein said selective etching is carried out in a dip etcher.

7. A method according to claim 1, wherein the amount of said water is 6.4-20% by weight.

8. A method according to claim 1, wherein the amount of hydrofluoric acid is 10-20% by weight based on hydrogen fluoride.

9. A method solution according to claim 1, wherein the amount of hydrofluoric acid is 15-20% by weight based on hydrogen fluoride.

10. A method according to claim 1, wherein the rato of the etching rate of doped silicate to the etching rate of undoped silicate is >300.

11. A combination comprising
   (a) an etching solution for the selective etching of doped silicate layers consisting essentially of
      5-20% by weight hydrofluoric acid based on hydrogen fluoride,
      an organic solvent mixture consisting essentially of at least two of ethylene glycol, propylene glycol, ethanol, and glycerol,
      and
      1-20% by weight water
   and
   (b) a doped silicate layer being in contact with the etching; solution
   and
   c) an undoped silicate layer underlying the doped silicate layer.

12. The combination according to claim 11, wherein said doped silicate is boron doped glass.

13. The combination according to claim 11, wherein said doped silicate is phosphorous doped glass.

14. The combination according to claim 11, wherein said doped silicate is boron-phosphorous doped glass.

15. The combination according to claim 11, wherein said solvent mixture consists essentially of ethylene glycol and glycerol in a mixing ratio of from 1:10 to 10:1.

16. The combination according to claim 11, wherein said solvent mixture consists essentially of ethylene glycol and glycerol in a mixing ratio of from 1:5 to 5:1.

17. The combination according to claim 11, wherein the amount of said water is 6.4-20% by weight.

18. A combination comprising
   (a) an etching solution for the selective etching of doped silicate layers consisting essentially of 5-20% by weight hydrofluoric acid based on hydrogen fluoride,
an organic solvent mixture consisting of at least two of ethylene glycol, propylene glycol, ethanol, and glycerol,
and
1-20% by weight water and
(b) a doped silicate layer being in contact with the etching; solution
and
c) an undoped silicate layer underlying the doped silicate layer.

* * * * *